United States Patent
Maturana et al.

(10) Patent No.: US 10,755,003 B2
(45) Date of Patent: Aug. 25, 2020

(54) TIME SYNCHRONIZATION OF SIGNAL TRANSMISSION INTERVALS FOR SIMULATING A MACHINE IN INDUSTRIAL AUTOMATION

(71) Applicant: ROCKWELL AUTOMATION TECHNOLOGIES, INC., Mayfield Heights, OH (US)

(72) Inventors: Francisco Maturana, Lyndhurst, OH (US); Haithem Mansouri, Beachwood, OH (US); Jaroslav Kriz, Klise (CZ)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 658 days.

(21) Appl. No.: 14/303,172

(22) Filed: Jun. 12, 2014

(65) Prior Publication Data

US 2015/0134313 A1    May 14, 2015

Related U.S. Application Data

(60) Provisional application No. 61/901,956, filed on Nov. 8, 2013.

(51) Int. Cl.
*G06F 30/20*    (2020.01)
*G06F 9/54*    (2006.01)
(Continued)

(52) U.S. Cl.
CPC .............. *G06F 30/20* (2020.01); *G05B 17/02* (2013.01); *G05B 19/0423* (2013.01);
(Continued)

(58) Field of Classification Search
CPC ........ G06F 17/5009; G06F 1/14; G06F 30/20; G05B 17/02; G05B 19/0423;
(Continued)

(56) References Cited

U.S. PATENT DOCUMENTS 5,485,620 A * 1/1996 Sadre ............... G05B 19/41865
    700/18
6,477,435 B1    11/2002 Ryan
(Continued)

FOREIGN PATENT DOCUMENTS

EP    1686442 A1    8/2006
EP    1942386 A1    7/2008
(Continued)

OTHER PUBLICATIONS

IEEE Standard for a Precision Clock Synchronization Protocol for Networked Measurement and Control Systems. IEEE Instrumentation and Measurement Society. IEEE 1588-2008. Jul. 24, 2008 [retrieved on Jan. 30, 2017]. Retrieved from <https://standards.ieee.org/findstds/standard/1588-2008.html>.*
(Continued)

*Primary Examiner* — Rehana Perveen
*Assistant Examiner* — Alfred H B Wechselberger
(74) *Attorney, Agent, or Firm* — Setter Roche LLP

(57) ABSTRACT

Systems, methods, and software to facilitate simulating machines used in industrial automation are disclosed herein. In at least one implementation, an API is utilized to establish at least a communication link between a simulation model created in a simulation application and an industrial controller system outside of the simulation model, wherein the simulation model comprises definitions for a virtual representation of at least a portion of a machine used in an industrial automation environment. Data is then exchanged between the industrial controller system and the simulation model over the communication link.

16 Claims, 9 Drawing Sheets

(51) Int. Cl.
*G06F 1/14* (2006.01)
*G05B 17/02* (2006.01)
*G05B 19/042* (2006.01)
*G05B 19/418* (2006.01)

(52) U.S. Cl.
CPC ... *G05B 19/0426* (2013.01); *G05B 19/41885* (2013.01); *G06F 1/14* (2013.01); *G06F 9/541* (2013.01); *G05B 2219/23446* (2013.01); *G05B 2219/23452* (2013.01); *G05B 2219/23456* (2013.01)

(58) Field of Classification Search
CPC .......... G05B 19/0426; G05B 19/41885; G05B 2219/23446; G05B 2219/23452; G05B 2219/23456
See application file for complete search history.

(56) References Cited

U.S. PATENT DOCUMENTS

| | | | | |
|---|---|---|---|---|
| 6,535,926 | B1 * | 3/2003 | Esker | H04J 3/0638 709/248 |
| 6,944,584 | B1 | 9/2005 | Tenney et al. | |
| 7,054,399 | B1 | 5/2006 | Hildebran | |
| 7,447,931 | B1 * | 11/2008 | Rischar | H04J 3/0697 368/46 |
| 7,467,018 | B1 | 12/2008 | Callaghan | |
| 7,649,925 | B2 * | 1/2010 | Fullerton | G01S 7/4052 342/105 |
| 7,818,457 | B1 * | 10/2010 | Flood | H04L 12/403 370/503 |
| 7,991,602 | B2 * | 8/2011 | Maturana | G05B 17/02 700/275 |
| 8,769,448 | B1 | 7/2014 | Sundararajan | |
| 9,223,754 | B2 * | 12/2015 | Belsky | G06F 17/13 |
| 2003/0016141 | A1 | 1/2003 | Sudolcan | |
| 2004/0078182 | A1 | 4/2004 | Nixon et al. | |
| 2004/0220790 | A1 * | 11/2004 | Cullick | G06Q 10/06 703/10 |
| 2006/0041859 | A1 * | 2/2006 | Vrancic | G06F 8/34 717/105 |
| 2007/0067458 | A1 | 3/2007 | Chand | |
| 2007/0288220 | A1 * | 12/2007 | Ehrmann | G05B 17/02 703/19 |
| 2008/0168092 | A1 * | 7/2008 | Boggs | G06F 17/5022 |
| 2008/0189636 | A1 | 8/2008 | Hood et al. | |
| 2009/0089027 | A1 | 4/2009 | Sturrock | |
| 2009/0089030 | A1 * | 4/2009 | Sturrock | G05B 17/02 703/7 |
| 2009/0089031 | A1 | 4/2009 | Sturrock et al. | |
| 2009/0089232 | A1 | 4/2009 | Baier et al. | |
| 2010/0030509 | A1 * | 2/2010 | Crain, II | G06F 19/00 702/123 |
| 2011/0071709 | A1 | 3/2011 | Damiani et al. | |
| 2011/0164625 | A1 * | 7/2011 | Fourcand | H04J 3/0667 370/498 |
| 2012/0084062 | A1 | 4/2012 | Maturana | |
| 2012/0084400 | A1 * | 4/2012 | Almadi | H04L 41/069 709/219 |
| 2012/0101613 | A1 | 4/2012 | Kapoor et al. | |
| 2012/0232869 | A1 | 9/2012 | Maturana et al. | |
| 2012/0324041 | A1 * | 12/2012 | Gerber | H04L 67/26 709/217 |
| 2013/0124613 | A1 | 5/2013 | Plache et al. | |
| 2013/0191106 | A1 * | 7/2013 | Kephart | G05B 17/02 703/21 |
| 2013/0212420 | A1 * | 8/2013 | Lawson | G05B 19/4185 713/400 |
| 2014/0047107 | A1 | 2/2014 | Maturana et al. | |
| 2014/0067091 | A1 | 3/2014 | Vishwanath | |
| 2014/0088927 | A1 | 3/2014 | Cao et al. | |
| 2014/0122915 | A1 * | 5/2014 | Frels | G06F 1/12 713/400 |
| 2014/0129002 | A1 | 5/2014 | Brandes et al. | |
| 2014/0156234 | A1 | 6/2014 | Maturana et al. | |
| 2015/0205893 | A1 | 7/2015 | Drumm et al. | |
| 2016/0349967 | A1 | 12/2016 | Ericsson et al. | |

FOREIGN PATENT DOCUMENTS

| | | |
|---|---|---|
| EP | 2498156 A2 | 9/2012 |
| EP | 2500791 A1 | 9/2012 |
| JP | 10-333712 A | 12/1998 |

OTHER PUBLICATIONS

Sverdlov, Etel. How to Set Up Time Synchronization on Ubuntu 12. In DigitalOcean Community [online]. Oct. 2, 2012 [retrieved on Feb. 1, 2017]. Retreived from < https://www.digitalocean.com/community/tutorials/how-to-set-up-time-synchronization-on-ubuntu-12-04>.*

Bloch, Joshua. How to Design a Good API & Why it Matters. InfoQ. Nov. 21, 2006 [retrieved on Feb. 3, 2017]. Retrieved from <https://www.infoq.com/presentations/effective-api-design>.*

Mills et al. Network Time Protocol. Version 4. RFC5905: Protocol and Algorithms Specification. RFC5905; Jun. 2010 [retrieved on Feb. 2, 2017]; ISSN: 2070-1721. Retreived from <http://www.rfc-base.org/rfc-5905.html>.*

Jay O. ClockSync Android App. AndroidPit. Feb. 14, 2012 [retrieved on Feb. 3, 2017]. Retrieved from < https://www.androidpit.com/clocksync-synchronise-watches >.*

"Periodic." Meriam-Webster Dictionary. Jan. 18, 2014 [retrieved on Jan. 23, 2017]. Retrieved from <https://web.archive.org/web/20140118062925/http://www.merriam-webster.com/dictionary/periodic>.*

NTP Time Server: LANTIME. Product Catalog [online]. Meinberg, May 7, 2013 [retrieved on Feb. 1, 2017]. Retrieved from <https://web.archive.org/web/20130507044318/http://www.meinbergglobal.com/english/products/ntptimeserver.htm>.*

"Universal Serial Bus Specification." Revision 2.0 (Apr. 2000) [retrieved on Aug. 22, 2017]. Retrieved from <http://sdphca.ucsd.edu/lab_equip_manuals/usb_20.pdf>.*

Harris, Ken. "An Application of IEEE 1588 to Industrial Automation." ISPCS 2008: Ann Arbor, Michigan (2008) [retrieved on Jan. 28, 2018]. Retrieved from <http://ieeexplore.ieee.org/abstract/document/4659216/>.*

Wikipedia contributors. "Application programming interface." Wikipedia, the Free Encyclopedia. [retrieved on Aug. 27, 2018]. Retrieved from <https://en.wikipedia.org/wiki/Application_programming_interface> (Year: 2018).*

Schierz et al. "Co-simulation with communication step size control in an FMI compatible . . . " 9th Inter. Modelica Conf, Munich ; doi: 10.3384/ecp12076205 [retrieved on Jul. 8, 2019]. <https://2012.international.conference.modelica.org/proceedings/htra/pdf/ecp12076205_SchierzArnoldClauss.pdf> (Year: 2012).*

Arnold, M. "Multi-Rate Time Integration for Large Scale Multibody System Models" Peter Eberhard (ed.), Multiscale Problems in Multibody System Contacts, pp. 1-10 [retrieved on Jul. 10, 2019]. Retrieved from <https://link.springer.com/chapter/10.1007/978-1-4020-5981-0_1> (Year: 2007).*

Awais et al. "The High Level Architecture RTI as a master to the Functional Mock-up Interface components" 2013 Inter. Conf. on Computing, Networking and Communications, Workshops Cyber Physical Sys., pp. 315-320 [retrieved on Jul. 11, 2019]. Retrieved from <https://ieeexplore.ieee.org/document/6504102/> (Year: 2013).*

Awais et al. "Using the Hla for Distributed Continuous Simulations" 2013 8th Eurosim Congress on Modelling and Simulation, pp. 544-549 [retrieved on Jul. 12, 2019]. Retrieved from <https://www.researchgate.net/publication/249998786_Using_the_HLA_for_Distributed_Continuous_Simulations> (Year: 2013).*

Awais et al. "Distributed Hybrid Simulation Using the HLA and the Functional Mock-up Interface" IECON 2013—39th Annual Conference of the IEEE Industrial Electronics Society; doi: 10.1109/IECON.2013.6700393 [retrieved on Jul. 5, 2019]. Retrieved from <https://ieeexplore.ieee.org/document/6700393> (Year: 2013).*

(56) References Cited

OTHER PUBLICATIONS

Linksys WAG54GP2 ADSL Gateway with 2 Phone Ports. Manual [online]. Page 42. Cisco Systems Inc, 2005 [retrieved on Dec. 29, 2016]. Retrieved from: http://downloads.linksys.com/downloads/userguide/WAG54GP2_ug.pdf.
Tulach, J., Practical API Design, 1st edition, APress, Jul. 2008, ISBN-10: 1430209739 (not provided).
Office Action issued in Chinese Application No. 201410645439.X, dated Sep. 27, 2016, 12 pages (with English translation).
E. Freund et al., "Real-Time Coupling of the 3D Workcell Simulation System COSIMIR," Jan. 1, 2002, retrieved from the Internet: URL:http://www.icita.org/previous/icita2002/ICITA2002/papers/110-11.pdf, retrieved on Jun. 6, 2016 Sections III-VI.
Henrik Carlsson et al., "Methods for Reliable Simultation-Based PLC Code Verification," IEEE Transactions on Industrial Informatics, IEEE Service Center, New York, NY, vol. 8, No. 2, May 1, 2012, pp. 267-278.
Babcock, N. "PLC Programming with RSLogix5000" pp. 35-41 and 70-78: Modem Media [retrieved on Sep. 29, 2018] from www.comptechweb.com/images/jr/Challenge/PLCProgrammingwithRSLogix5000.pdf, 2009.
Iacob, et al., "Implementation of Hardware-in-the-Loop System for Drum-Boiler Turbine Decoupled Multivariable Control" 6th IEEE International Symposium on Applied Computational Intelligence and Informatics [retrieved on Sep. 29, 2018] from www.ieeexplore.ieee.org/stamp/stamp.jsp?tp=&arnumber=5872971, 2011.
Vrba et al., "Simulation in Agent-based Manufacturing Control Systems" 2005 IEEE International Conference on Systems, Man and Cybernetics; 10.1109/ICSMC.2005.1571396 [retrieved on Sep. 29, 2018] from www.ieeexplore.ieee.org/abstract/document/1571396, 2005.
Vrba et al., "Rockwell Automation's Holonic and Multiagent Control Systems Compendium" IEEE Transactions on Systems, Man, and Cybernetics, vol. 41, No. 1 [retrieved on Sep. 29, 2018] from www.ieee.org/abstract/document/5545420/, 2011.
McLean et al. "An Architecture and Interfaces for Distributed Manufacturing Simulation" Simulation, vol. 81, Iss. 1, pp. 15-32 [retrieved on Aug. 18, 2019]. Retrieved from <https://dl.acm.org/citation.cfm?id=1057573> (Year:2005).
Hibino et al. "Manufacturing Adapter of Distributed Simulation Systems Using HLA" Proceedings of the 2002 Winter Simulation Conference, pp. 1099-1107 [retrieved on Aug. 18, 2019]. Retrieved from <https://ieeexplore.iee.org/document/1166363> (Year: 2002).
Elsheikh et al. "Modelica-Enabled Rapid Prototyping of Cyber-Physical Energy Systems Via the Functional Mockup Interface" [retrieved on Jul. 11, 2019]. Retrieved from <https://ieeexplore.ieee.org/document/6623315> (Year: 2013).
Palachi et al. "Simulation of cyber physical models using SysML and numerical solvers", IEEE International Systems Conference (Jul. 2013) [retrieved on Jul. 9, 2019]. Retrieved from <https://ieeexplore.ieee.org/abstract/document/6549954/> (Year: 2013).

* cited by examiner

TIME SYNCHRONIZATION OF SIGNAL TRANSMISSION INTERVALS FOR SIMULATING A MACHINE IN INDUSTRIAL AUTOMATION

RELATED APPLICATIONS

This application hereby claims the benefit of, and priority to, U.S. Provisional Patent Application No. 61/901,956, entitled "INTEGRATING CONTROLLERS WITH SIMULATIONS", filed Nov. 8, 2013, and which is hereby incorporated by reference in its entirety for all purposes.

TECHNICAL BACKGROUND

Simulation of industrial equipment can be essential in designing, prototyping, and demonstrating the different design options to engineers, customers, and other interested parties. Such simulations can be utilized to emulate virtualized operation of their corresponding physical devices over time, and may be further used in providing visual representations of the various simulated devices. In some examples, simulation and modeling applications may be used to define parameters for simulated mechanical components. These parameters ensure that the emulated equipment performs in the same manner during a simulation as can be expected for their real-world counterparts.

In addition to the physical industrial equipment that provides the mechanical functionality to perform various industrial operations, controller systems are also essential components of an industrial automation environment. Industrial controller systems are typically utilized to provide control instructions to physical machines to accomplish various tasks in an industrial plant, such as product manufacturing, materials handling, batch processing, supervisory control, and other industrial functions. As a result, by combining industrial machinery with the proper controller, an industrial system can be created that is capable of performing various operations.

Overview

Systems, methods, and software to facilitate simulating machines used in industrial automation are disclosed herein. In at least one implementation, an API is utilized to apply timestamps to data exchanged between a simulation model created in a simulation application and an industrial controller system external to the simulation model. The timestamps are then processed to synchronize the simulation model and the industrial controller system.

This Overview is provided to introduce a selection of concepts in a simplified form that are further described below in the Technical Disclosure. It should be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

The following description and associated drawings teach the best mode of the invention. For the purpose of teaching inventive principles, some conventional aspects of the best mode may be simplified or omitted. The following claims specify the scope of the invention. Some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by claims and their equivalents.

Industrial automation environments, such as automobile manufacturing factories, food processing plants, oil drilling operations, microprocessor fabrication facilities, and other types of industrial enterprises, typically employ several machines and other equipment to carry out their business operations. For example, an industrial automation enterprise could employ machines comprising sensors, drives, pumps, filters, drills, motors, robots, mills, printers, carousels, fabrication machinery, or any other industrial automation equipment. During the design, prototyping, and testing phases of product development, these machines and other devices used in industrial automation may be simulated using computing systems to provide virtual representations to engineers and customers of the end product. These simulations typically include physical attributes, parameters, and other aspects of the machine being simulated to ensure a proper emulation is furnished by the computing system. In some examples, a user may desire to have control over a simulated device to further illustrate the functionality and operation of the device as can be expected when physically implemented. As a result, the user may prefer to attach one or more real or emulated controllers to the simulated device to demonstrate and test the different controllable operations of the device.

Figure 1A:
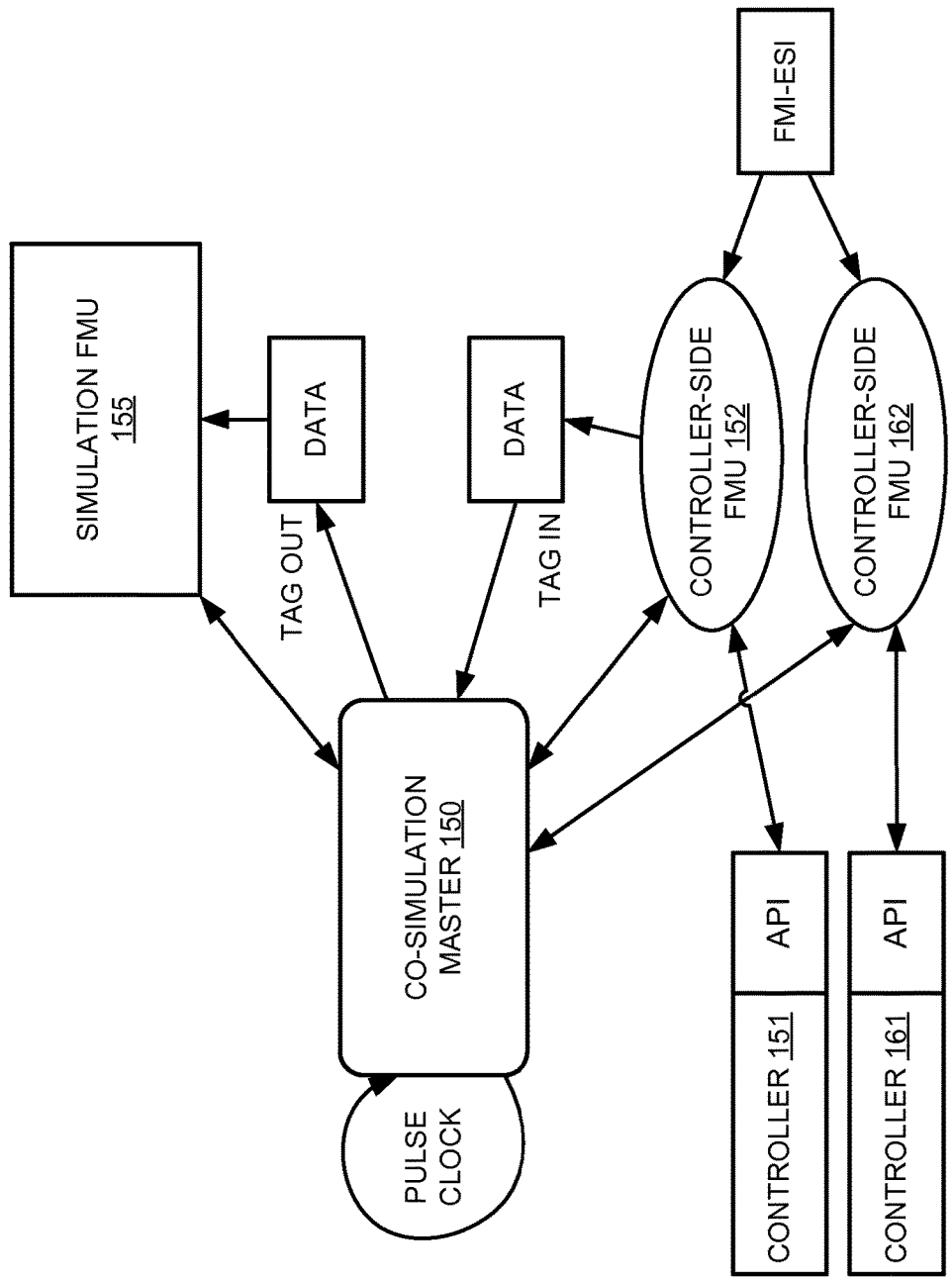
FIG. 1A is a block diagram that illustrates an overview of synchronizing multiple controllers with simulated industrial devices.

FIG. 1A is a block diagram that illustrates an overview 101 of synchronizing multiple controllers 151-152 with simulated industrial devices. FIG. 1A shows a functional mock-up interface emulation simulation interface (FMI-ESI), controllers 151 and 161, controller-side functional mock-up unit (FMU) 152 and FMU 162, co-simulation master 150, and simulation FMU 155.

Controllers 151 and 161 typically each comprise an industrial controller, which could include automation controllers, programmable logic controllers (PLCs), or any other controllers used in automation control. Controllers 151 and 161 could comprise one or more physical and/or emulated controllers implemented in software—including combinations thereof. In this example, each controller 151 and 161 has an associated controller-side FMU 152 and 162, respectively. Each controller-side FMU 152 and 162 includes an application programming interface (API) that may be used to read and write tags and synchronize time between the controllers 151 and 162 and their respective controller-side FMUs 152 and 162.

Simulation FMU 155 comprises definitions for a virtual representation of at least a portion of a machine used in an industrial automation environment. Simulation FMU 155 is typically created, at least in part, using a simulation application that complies with the FMI standard, so that FMI may be used to wrap the simulation module inside of an FMU. For example, the simulation application could comprise a third-party simulation framework tool, such as MATLAB® Simulink™, although the simulation application could comprise any other suitable simulation application or combination of applications in some implementations. Each FMU provides an interface for exchanging data with other FMUs.

In operation, a tag server within the FMI-ESI provides distributed communication connectivity services for connecting the communicating parts on the controller side. The communication between controller-side FMUs 152 and 162 and the simulation FMU 155 is coordinated by the co-simulation master 150, which also complies with FMI. The clock synchronization is typically performed in two phases. First, the co-simulation master 150 coordinates global time among all the FMUs 152, 162, and 155, which involves sending a clock pulse to each FMU at each time step interval in order to inject the global time into each FMU. Second, the tag server service within the FMI-ESI coordinates controller-side FMU time among the controllers 151 and 161. In this example, since there is more than one controller-side FMU 152 and 162, the co-simulation master 150 handles the time synchronization among them.

The FMI-ESI tool may be used to expose the input/output (I/O) interface from the controller side into the FMU side, which necessitates the controller-side FMUs 152 and 162. Each controller-side FMU 152 and 162 typically has one or more controllers under its supervision. In this example, controller-side FMU 152 handles controller 151, and controller-side FMU 162 handles controller 161. The FMI-ESI tool used to configure each controller-side FMU 152 and 162.

When executing the simulation at runtime, the FMI co-simulation master 150 coordinates the data exchange and clocks among the FMUs 152, 162, and 155. The tag server within the FMI-ESI coordinates the clock and data exchange among the controllers 151 and 161 under each controller-side FMU 152 and 162. In other words, the FMI-ESI may be used to configure the controller-side FMUs 152 and 162 to interoperate with the simulation FMU 155 and other types of FMUs (not shown). The co-simulation master 150 coordinates the data exchange and global time between the FMUs 152, 162, and 155, and the tag server portion of the FMI-ESI in this case grabs the local time of each controller-side FMU 152 and 162 to facilitate synchronizing the controllers 151 and 161 under their supervision.

Figure 1B:
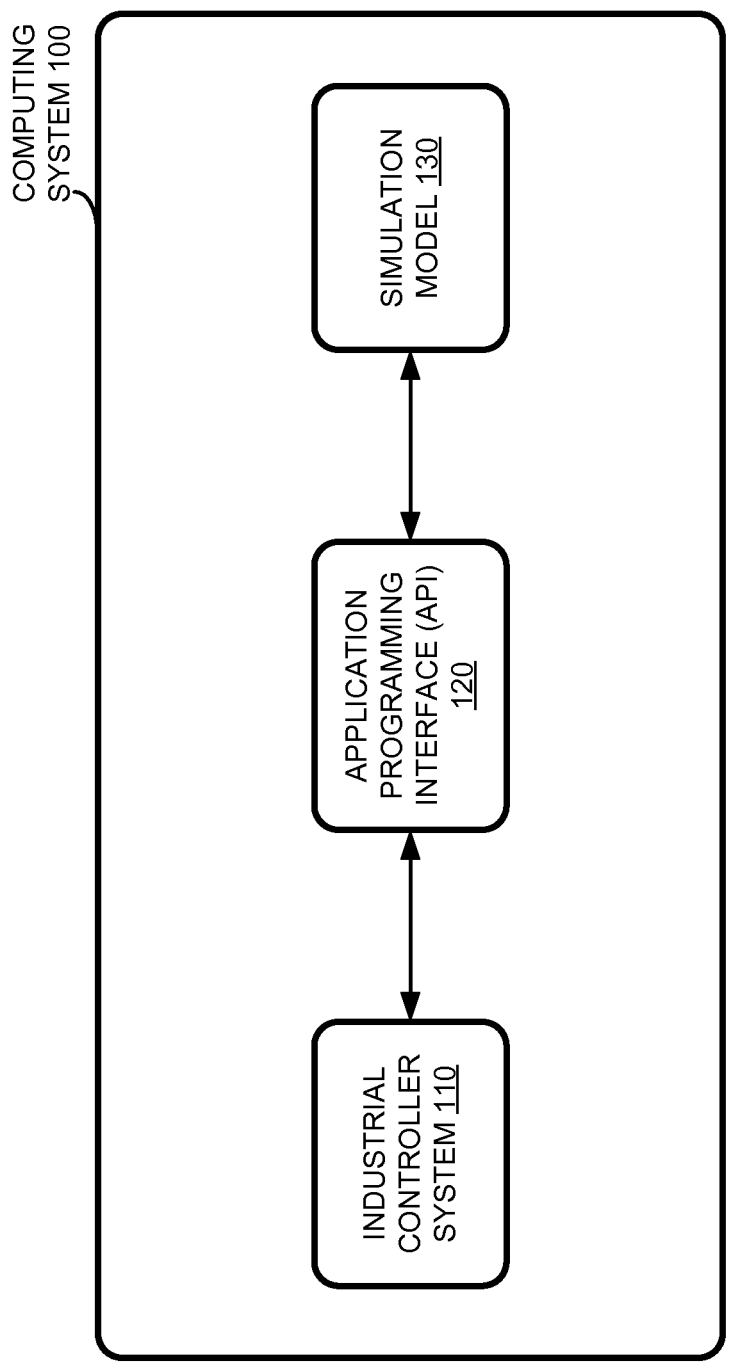
FIG. 1B is a block diagram that illustrates a computing system that may be used to facilitate simulating machines used in industrial automation.

FIG. 1B is a block diagram that illustrates computing system 100 that may be used to facilitate simulating machines used in industrial automation. Computing system 100 includes industrial controller system 110, application programming interface (API) 120, and simulation model 130. Computing system 100 is representative of any computing environment, which could include several different systems and devices located in geographically diverse areas and interconnected via communication networks in a distributed manner in some examples.

Industrial controller system 110 comprises, for example, an industrial controller, which could include automation controllers, programmable logic controllers (PLCs), or any other controllers used in automation control. Industrial controller system 110 could comprise one or more physical and/or emulated controllers implemented in software—including combinations thereof. Simulation model 130 comprises definitions for a virtual representation of at least a portion of a machine used in an industrial automation environment. Simulation model 130 is typically created, at least in part, using a simulation application. In some implementations, the simulation application employed may comply with the FMI standard, so that FMI may be used to wrap the simulation module inside of an FMU. For example, the simulation application could comprise a third-party simulation framework tool, such as MATLAB® Simulink™, although the simulation application could comprise any other suitable simulation application or combination of applications in some implementations. API 120 provides an interface that enables communication between industrial controller system 110 and simulation model 130, among other functionality. An operation of computing system 100 will now be described with respect to FIG. 2.

Figure 2:
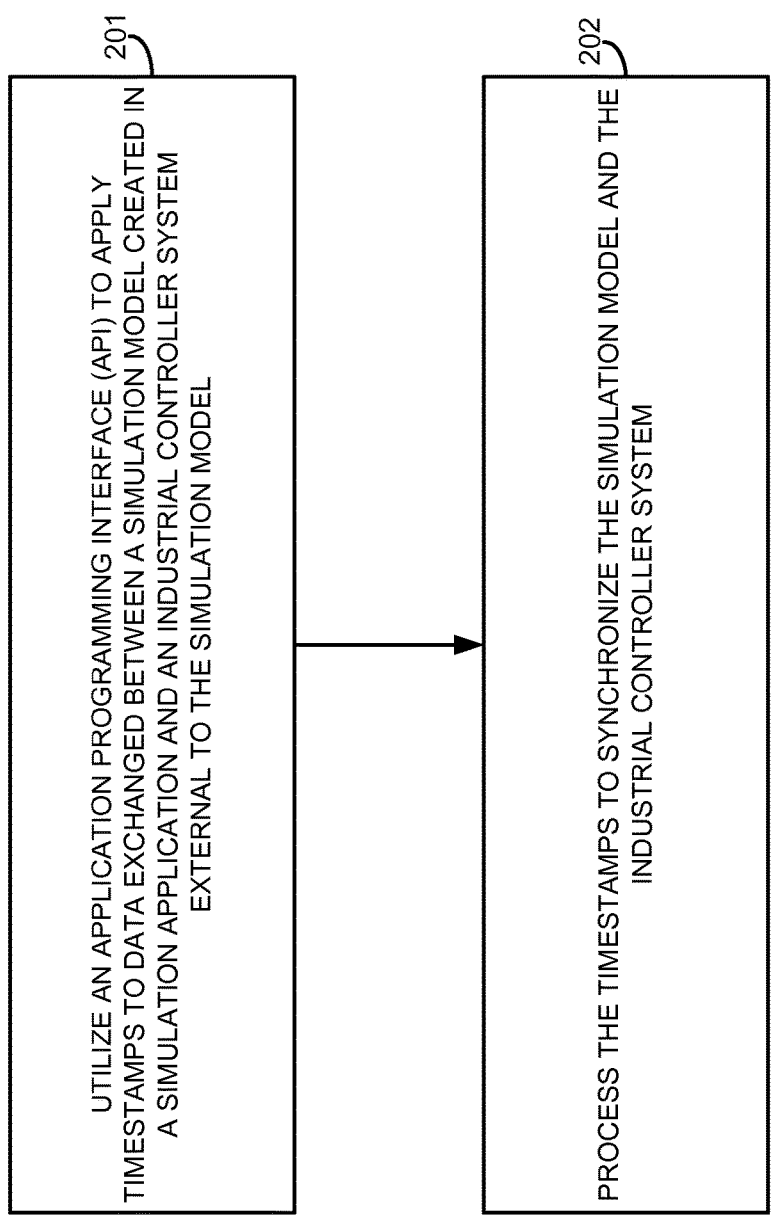
FIG. 2 is a flow diagram that illustrates an operation of a computing system in an exemplary implementation.

FIG. 2 is a flow diagram that illustrates an operation 200 of computing system 100 in an exemplary implementation. The operation 200 shown in FIG. 2 may also be referred to as synchronization process 200 herein. The steps of operation 200 are indicated below parenthetically. The following discussion of synchronization process 200 will proceed with reference to computing system 100 of FIG. 1B in order to illustrate its operations, but note that the details provided in FIG. 1B are merely exemplary and not intended to limit the scope of synchronization process 200 to the specific implementation shown in FIG. 1B.

Synchronization process 200 may be employed to operate computing system 100 to facilitate simulating machines used in industrial automation. As shown in the operational flow of synchronization process 200, computing system 100 utilizes an application programming interface (API) 120 to apply timestamps to data exchanged between a simulation model created in a simulation application and an industrial controller system external to the simulation model (201). In some implementations, the industrial controller system 110 could comprise one or more physical industrial controller devices, emulated industrial controllers implemented in software, or any other control system—including combinations thereof. The simulation model 130 may typically comprise definitions for a virtual representation of at least a portion of a machine used in an industrial automation environment. For example, the simulation model 130 could define the design and parameters of an entire robot, or could define an individual component of the robot, such as an arm joint, drive motor, articulation mechanism, or some other portion of the robot. In some examples, the simulation model 130 could include information for rendering a three dimensional visualization of the machine, or at least a portion thereof.

Among other functionality, API 120 may facilitate data exchange between the simulation model 130 and the industrial controller system 110 in a bidirectional manner. For example, the data transferred from the industrial controller system 110 to the simulation model 130 could comprise control signals used to drive the simulation, and the data received by the industrial controller system 110 from the simulation model 130 could comprise feedback, operational status, and other information associated with the execution of the simulation model 130. In some implementations, API 120 could be utilized to establish at least one communication link between the industrial controller system 110 and the simulation model 130 by linking ports associated with the industrial controller system 110 to the simulation model 130 to create an input and output interface between the industrial controller system 110 and the simulation model 130. Data may then be exchanged over the communication link between the industrial controller system 110 and the simulation model 130 by utilizing the input and output interface to transfer control program parameters, control signals, and other information between the industrial controller system 110 and the simulation model 130. The simulation model 130 may then utilize the data received from the industrial controller system 110 to generate an animated visualization of a machine being simulated. For example, the data from the industrial controller system 110 could direct the simulation model 130 to move and animate a three dimensional visualization of the simulated machine in the same manner that the industrial controller system 110 could drive the physical machine itself.

In some implementations, API 120 may be utilized to apply timestamps to any of the data exchanged between the industrial controller system 110 and the simulation model 130. For example, API 120 could be utilized to apply a first timestamp to data as soon as it is transferred by the industrial controller system 110 for delivery to the simulation model 130, and to apply a second timestamp immediately before providing the data to the simulation model 130, and vice versa. Other techniques of utilizing API 120 to apply timestamps to data exchanged between the simulation model 130 and the industrial controller system 110 are contemplated and within the scope of this disclosure.

The timestamps are then processed to synchronize the simulation model 130 and the industrial controller system 110 (202). In some embodiments, the timestamps may be utilized to determine the timing of when to provide the data to the simulation model 130 or the industrial controller system 110 to achieve synchronization. In at least one implementation, processing the timestamps to synchronize the simulation model 130 and the industrial controller system 110 could comprise coordinating signal transmission intervals of the simulation model 130 and the industrial controller system 110 using the timestamps. Coordinating the signal transmission intervals between the simulation model 130 and the industrial controller system 110 is necessary in some examples because the signal transmission intervals could often comprise different rates. In some implementations, processing the timestamps to synchronize the simulation model 130 and the industrial controller system 110 could comprise providing a periodic clock pulse to the simulation model 130 and the industrial controller system 110 to advance the simulation model 130 and the industrial controller system 110 ahead one time step. Note that the time step size for the simulation model 130 and the industrial controller system 110 could comprise different values, but would both be advanced by the appropriate amount responsive to the periodic clock pulse. Additionally, in implementations where the industrial controller system 110 comprises multiple controllers, each controller could have a different time step size, and each of these controllers could be further synchronized at each clock pulse by dynamically calculating the deltas for use in compensating for the differences in time step size between the multiple controllers.

Advantageously, the API 120 may be utilized to apply timestamps to data exchanged between the simulation model 130 and the industrial controller system 110. The timestamps may then be processed in order to facilitate synchronization between the execution of the simulation model 130 and the industrial controller system 110. In this manner, the simulation model 130 is able to receive and interpret control signals transmitted by the industrial controller system 110 at the appropriate timing to achieve smooth and harmonious operation of the simulation, thereby increasing the value and utility of the simulation model 130 through integration and synchronization with the industrial controller system 110.

Figure 3:
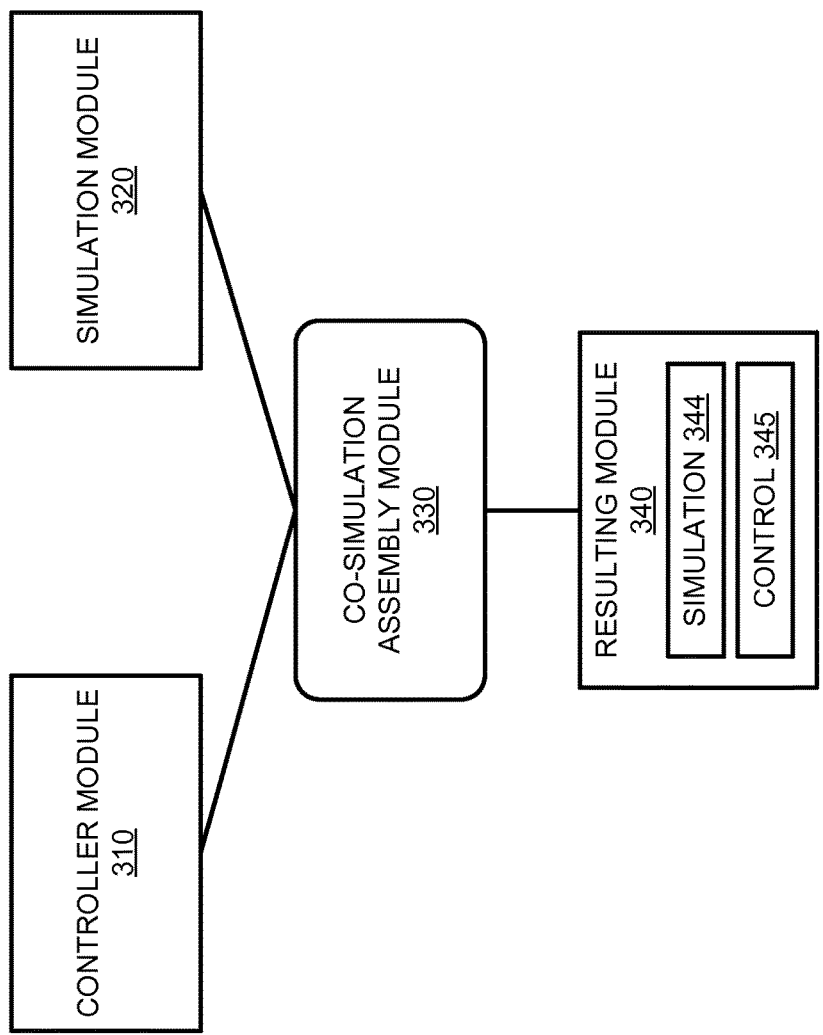
FIG. 3 is a block diagram that illustrates an overview of implementing controllers with simulated industrial devices.

Turning now to FIG. 3, FIG. 3 is a block diagram that illustrates an overview 300 of implementing controllers with simulated industrial devices. Overview 300 includes controller module 310, simulation module 320, co-simulation assembly module 330, and resulting module 340. Controller module 310 may be any physical or emulated controller configured to manage one or more devices in an industrial automation system. In some implementations, controller module 310 may be configured to provide control instructions that direct physical and/or simulated machines, or their individual components, to move or perform some action in three-dimensional space, such as controlling the motion of a robot arm. Simulation module 320 may be configured to generate a simulation model comprising simulation files that define various properties, parameters, and physical attributes of a real-world industrial device to ensure that the simulated device looks and operates in the same manner as the physical device from which it is modeled.

Typically, the baseline controller is a physical hardware device in which a control program may be executed. A control program may then be loaded that is targeted to that specific controller hardware in order to retarget it to an emulation controller implemented in software. Thus, one workflow includes moving from physical to emulation control which allows for improved modeling versatility. Once in an emulation model, the emulation controller may interact with the simulation model. Another workflow considers a case in which the control program is fully designed in the emulation controller against the simulation. In this case, once the control program has been designed, it can be retargeted to the hardware controller. Notably, in both of the above transitions, the input/output (I/O) interface is preserved between the physical machine and the physical controller or the simulated machine and the emulation controller.

In operation, a user, an engineer, or some other entity may generate a simulation within simulation module 320. Such a simulation may be used to model various industrial equipment, including robotic, fabrication, assembly, and other types of equipment. In addition to generating the simulation, a user may further wish to control the simulation using an industrial controller from controller module 310. Controller module 310 as used herein is intended to represent a real, physical controller device or an emulated controller implemented in software that provides control instructions to the generated simulation. For example, if the simulation was used to emulate a robotic arm, one or more controllers could be used to manage and control the movement and articulation of the arm.

Once the controller and the simulation have been selected, the controller and simulation are then formatted using co-simulation assembly module 330. In some examples, co-simulation assembly module 330 can be used to format the controller and the simulation using a functional mock-up interface (FMI). FMI defines a standardized interface to be used in computer simulations to develop complex cyber-physical systems. These cyberphysical systems are represented in functional mock-up units (FMUs) that provide the functions necessary to generate the simulation. The functional mock-up units typically include an extensible markup language (XML) file comprising definitions of the variables used by the FMUs, equations used by the model, which may be defined as a set of functions, and other optional data, such as parameter tables, a user interface, and documentation which may be needed by the model, among other things.

In the present example, the FMI further includes information necessary to provide the control functions. As a result, necessary portions of the control functions are implemented in functional mock-up units to make the controls appear as simulation information within the FMI. The combination of the simulation functional mock-up units 344 and the control functional mock-up units 345 are used to provide resulting module 340. Although illustrated using a functional mock-up interface, it should be understood that resulting module 340 could take the form of any other similar standardized interface for simulation. An emulation simulation interface environment is used to provide for this interface which is unique to each specific control system vendor. Translators may be provided throughout the emulation simulation interface from industrial control space to FMI space and vice versa.

In some examples, a user may control the simulation directly from the control functional mock-up units. Thus, the control functional mock-up units include all of the necessary functions to both receive a control instruction and execute that function. In other implementations, the control functional mock-up units may contain only the portion of information necessary to control the simulation. As a result, an external controller that receives input from the user may communicate with the control functional mock-up units using an application programming interface (API), such as API 120 as shown in FIG. 1B.

Figure 4:
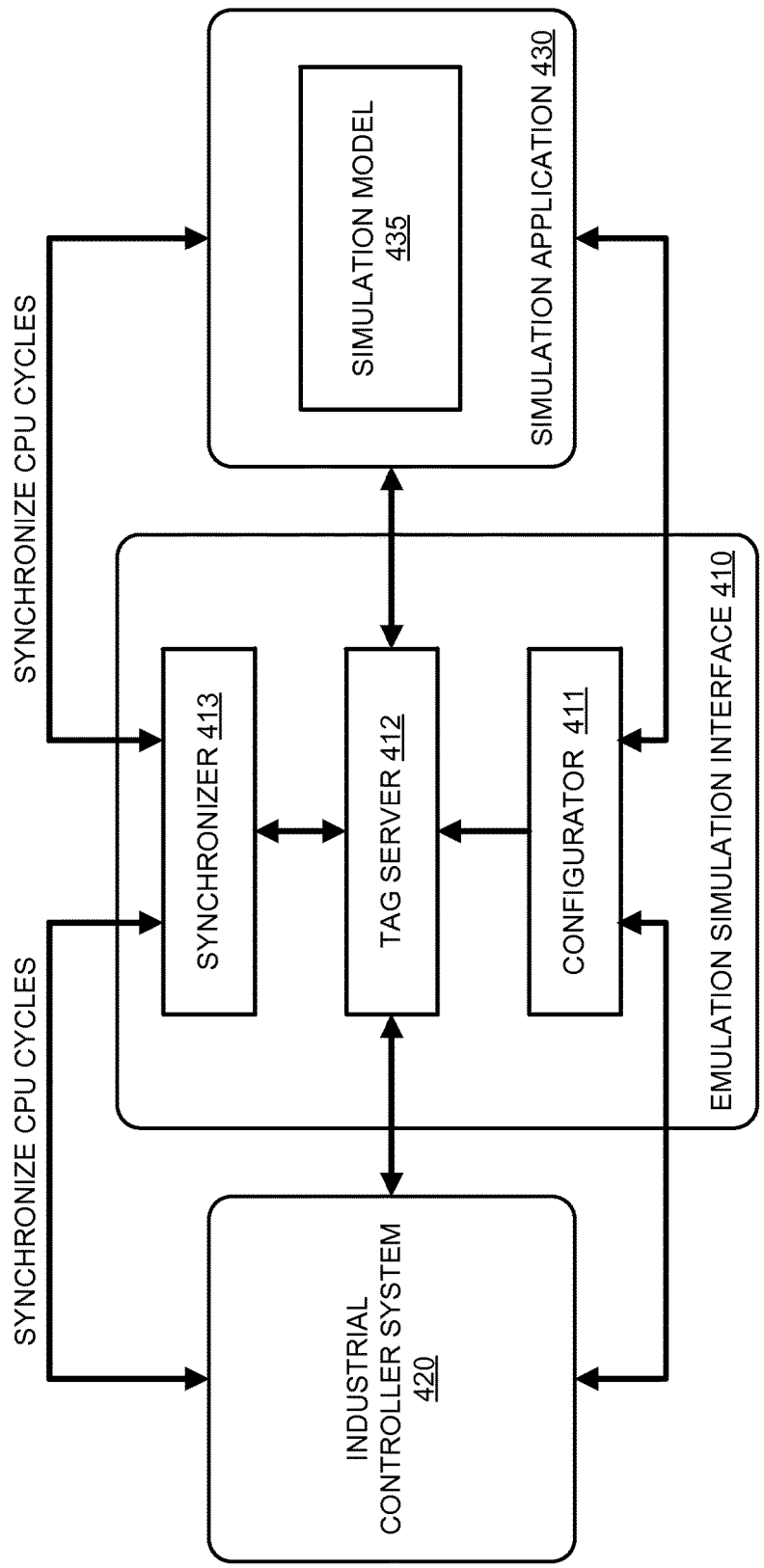
FIG. 4 is a block diagram that illustrates an operational scenario involving a computing system in an exemplary implementation.

Referring now to FIG. 4, FIG. 4 is a block diagram that illustrates an operational scenario 400 involving a computing system in an exemplary implementation. The computing system executes emulation simulation interface 410 and may execute some or all of the operations of industrial controller system 420 and simulation application 430. In some examples, the computing system could be a single device or could be distributed across many different systems and devices separated over diverse geographic areas.

As shown in FIG. 4, the emulation simulation interface 410 includes a configurator module 411, a tag server 412, and a synchronizer 413. In this example, the industrial controller system 420 comprises a virtual controller emulator, such as RSLogix™ Emulate 5000 provided by Rockwell Automation, Inc. The simulation application 430 could comprise any third-party simulation framework tool that complies with the FMI standard, but the MATLAB® Simulink™ tool is used in this example. Thus, the simulation model 435 could comprise a .mdl file created in MATLAB® using library blocks for different systems.

The emulation simulation interface 410 is used to connect controller tags to the simulation model 435 in MATLAB®. To connect the virtual controller output signals to the simulation model 435, it is necessary to establish an interface between the simulation model 435 and the industrial controller system 420. To this end, the emulation simulation interface 410 will set up an interface between input/output (I/O) signals of the controller 420 with the simulation model 435. The interface established by the emulation simulation interface 410 enables connectivity and data exchange in a bidirectional manner between the simulation model 435 and the controller 420. In this example, the emulation simulation interface 410 uses a virtual controller emulator such as RSLogix™ Emulate 5000 to encapsulate the control programs. The controller emulator mimics the operation of a ControlLogix™ programmable logic controller (PLC) but in software only. The virtual controller 420 transfers data to the simulation using output tags and receives data from the simulation using input tags.

The configurator component 411 hosts the application-level information for connecting the virtual controller 420 with the simulation model 435. Tag server 412 coordinates the input and output tags for data exchange. In some implementations, tag server 412 provides distributed communication connectivity services for connecting the communicating parts in the controller side of the spectrum. The co-simulation master from FMI coordinates communication between the FMUs. Underneath the tag server service, the controllers and their respective communications are coordinated with simulations, which can become a very complex network of communicating units.

The synchronizer 413 coordinates the clock progression between the controller 420 and the simulation model 435 to keep them synchronized. The clock synchronization is typically carried out in two phases. First, the co-simulation master coordinates global time among FMUs. Second, the tag server service 412 coordinates control level FMU time among the controllers. In situations where there is more than one control level FMU, time synchronization among them may be handled by the co-simulation master. An example of how the execution of a controller and a simulation may be synchronized at runtime will now be discussed with respect to FIG. 5.

Figure 5:
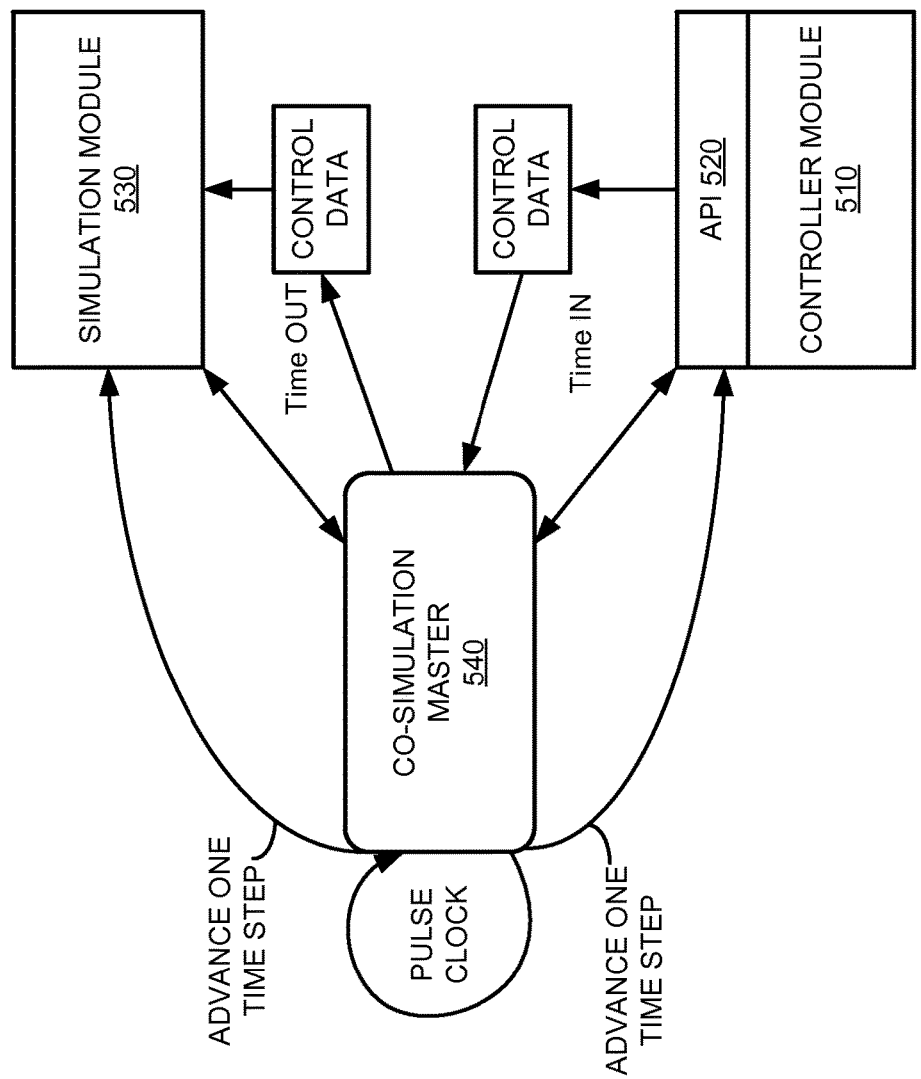
FIG. 5 is a block diagram that illustrates an operational scenario for synchronizing a controller and a simulation in an exemplary implementation.

FIG. 5 is a block diagram that illustrates an operational scenario 500 for synchronizing a controller and a simulation in an exemplary implementation. Operational scenario 500 involves controller module 510, simulation module 530, and co-simulation master 540. Controller module 510 includes API 520. In this example, controller module 510 comprises a controller-side FMU and simulation module 530 comprises a simulation FMU.

In operation, API 520 of controller module 510 generally reads and writes tags for data exchanged between the controller module 510 and the simulation module 530, and functions to synchronize the timing associated with this data exchange and execution of the simulation. For example, the signal transmission intervals of the controller module 510 and the simulation model 530 may be exchanged at different time rates, and the co-simulation master 540 works in conjunction with API 520 to compensate for these different rates to achieve synchronization.

In this example scenario, controller module 510 is transferring control data to the simulation module 530. Co-simulation master 540 provides an interface to connect the controller module 510 FMU and the simulation module 530 FMU. As controller module 510 transfers the control data to simulation module 530, co-simulation master 540 utilizes API 520 to apply a first timestamp to the control data to mark the time in. Co-simulation master 540 then provides the control data to simulation module 530 and a second timestamp is applied to the data to mark the time out. In this manner, co-simulation master 540 is aware of what time the controller module 510 intended to provide the control data to the simulation module 530 based on the first timestamp noting the time in, and what time the simulation module 530 actually receives the control data based on the second timestamp noting the time out.

To ensure the controller module 510 and the simulation module 530 are operating in a synchronized manner, co-simulation master 540 calculates time offsets for the control data based on the timestamps to compensate for delay and other timing anomalies. The co-simulation master 540 then advances the master clock one clock cycle and sends a clock pulse to both the controller module 510 and the simulation module 530 to advance each module ahead one time step. Note that the time step size may not be the same size for the simulation module 530 and the controller module 510.

In some examples, the FMUs of both the simulation module 530 and the controller module 510 are configured to emit periodic pulses, such as every twenty milliseconds, into the simulation and controller, respectively, to advance in time at the appropriate time step sizes, since as noted above, the time step sizes may not be the same size for the simulation module 530 and the controller module 510. Also, in implementations where the controller module 510 includes multiple controllers, each of the controllers in the controller module 510 could be operating at different time step sizes. An example of how multiple controllers that operate at different time step sizes could be synchronized will now be discussed in greater detail with respect to FIG. 6.

Figure 6:
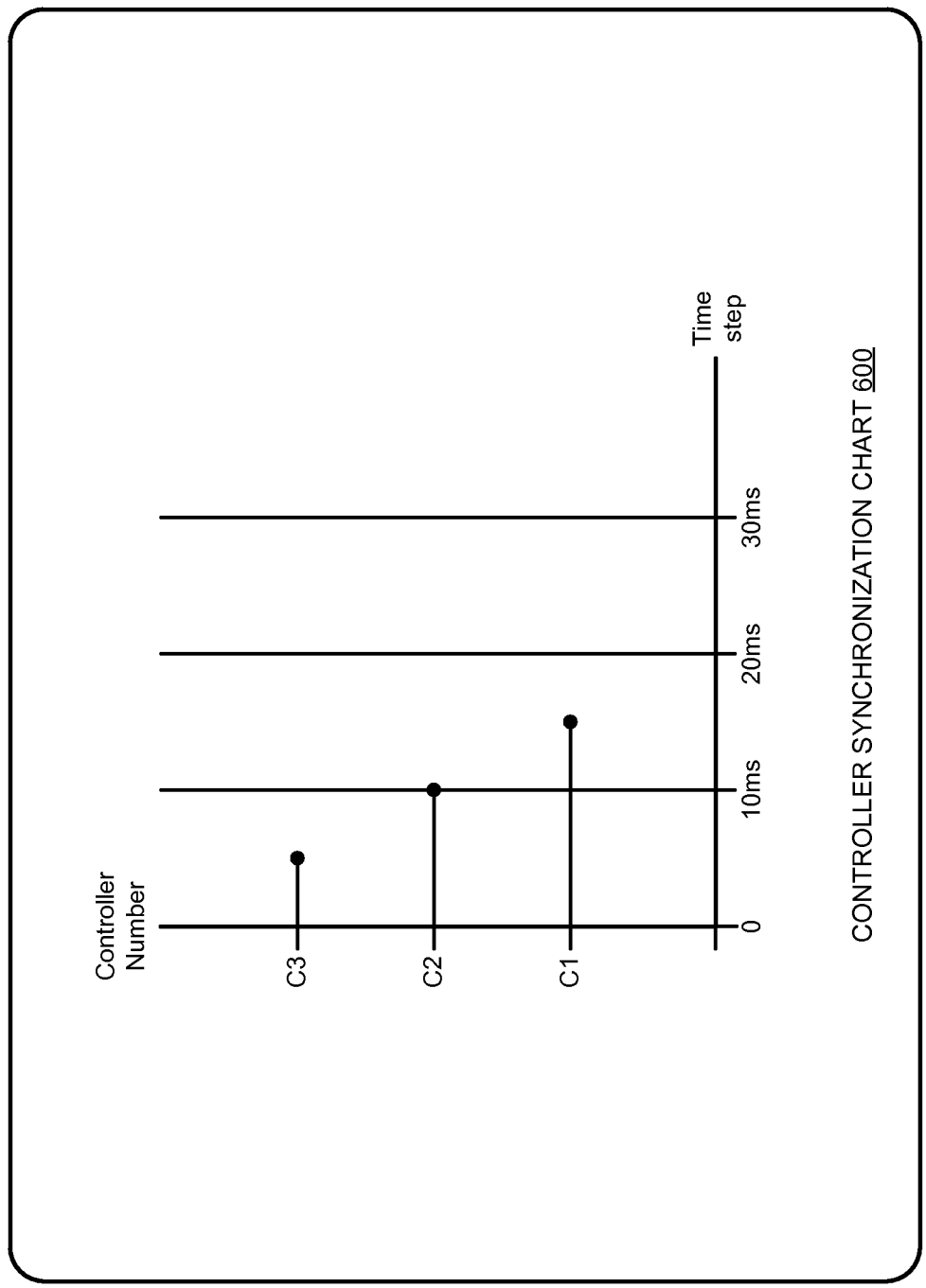
FIG. 6 is a controller synchronization chart that illustrates an exemplary technique of synchronizing multiple controllers.

FIG. 6 is a controller synchronization chart 600 that illustrates an exemplary technique of synchronizing multiple controllers. The multiple controllers could comprise several separate physical controller devices, multiple independent emulated controllers implemented in software, or combinations thereof. For example, multiple controllers could be used to control several separate components of a single machine being simulated, such as various drive motors, articulation mechanisms, and other parts of the machine. In this example, the controllers are numbered C1, C2, and C3. The time step size in this example is ten milliseconds, as shown along the horizontal x-axis of controller synchronization chart 600.

As shown in controller synchronization chart 600, after a first iteration, controller C1 has advanced fifteen milliseconds, C2 has advanced ten milliseconds, and C3 has advanced five milliseconds. These different intervals are then processed to dynamically calculate time offsets from the time step size of ten milliseconds in order to compensate for the different signal transmission intervals of the controllers C1, C2, and C3. For controller C1, the time offset is calculated to be a plus five millisecond delta from the time step size, since C1 advanced fifteen milliseconds but the time step size is only ten milliseconds. The next time step for controller C1 is then calculated by subtracting the delta from the time step size, so with a time step size of ten milliseconds minus a plus five millisecond delta, C1 should only advance five milliseconds on the next time step to achieve synchronization with the other controllers and the ten millisecond time step size.

Controller C2 has a time step size of ten milliseconds, which matches the time step size of the simulation. Thus, no offset needs to be calculated and no compensation of the time step size of controller C2 is necessary for synchronization. Controller C3 has a time step size of only five milliseconds, so the time offset is calculated to be a negative five millisecond delta from the time step size of ten milliseconds. The next time step for controller C3 is then calculated by subtracting the delta from the time step size, so with a time step size of ten milliseconds minus a negative five millisecond delta, C1 should advance fifteen milliseconds on the next time step to achieve synchronization with the other controllers and the overall ten millisecond time step size. As the simulation advances, the offsets for each of the controllers C1, C2, and C3 are then continually recalculated dynamically at each time step to ensure synchronization persists. In this manner, the simulation model proceeds to learn the amplitude and frequency of the sinusoidal time progression of each of the controllers C1, C2, and C3.

Figure 7:
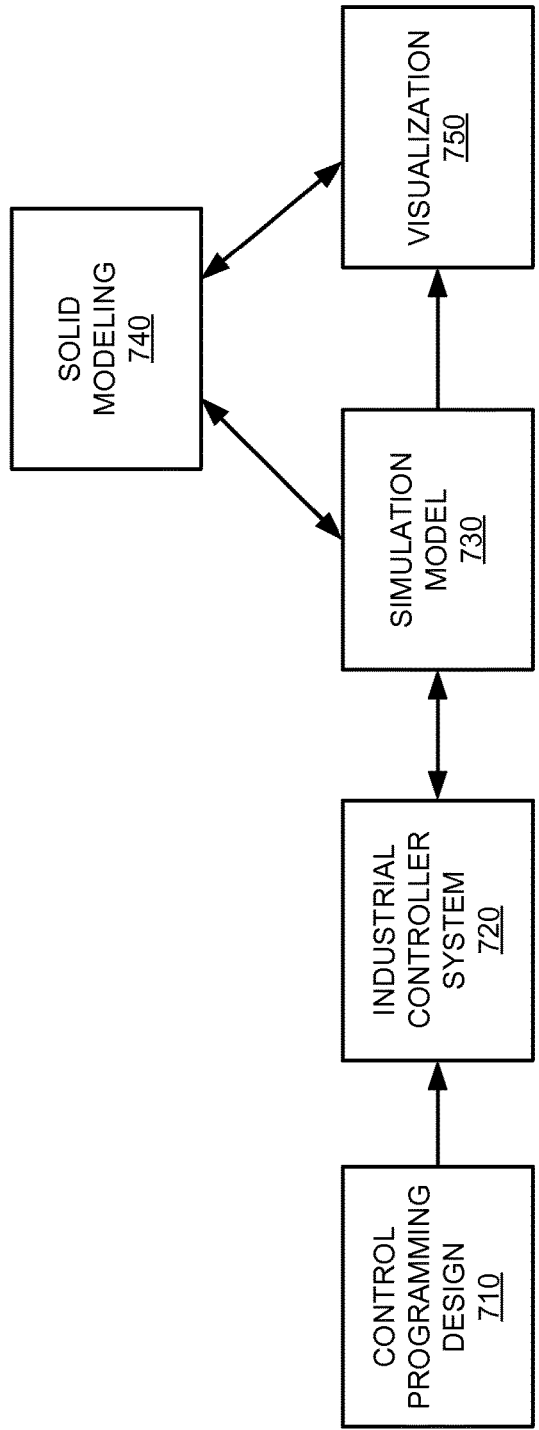
FIG. 7 is a block diagram that illustrates an operational scenario involving a computing system in an exemplary implementation.

FIG. 7 is a block diagram that illustrates an operational scenario 700 involving a computing system in an exemplary implementation. Operational scenario 700 is capable of creating and operating a machine simulation in an industrial automation environment. To integrate design, control, simulation, and visualization, the following system and work flow may be used. According to an example, the system architecture may consist generally of five main parts: control program design 710, industrial controller system 720, simulation modeling 730, computer-aided design (CAD) solid modeling 740, and visualization 750. Various industry-based tools and open source software may be used to implement these design goals.

In an example, control programming design 710 may be carried out using a control programming tool, such as the Studio5000™ programming tool by Rockwell Automation, Inc. Control program execution is handled by industrial controller system 720, which could comprise an emulated virtual controller implemented in software, such as RSLogix™ Emulate 5000 by Rockwell Automation, Inc. Simulation modeling 730 can be performed by any simulation framework tool, such as the MATLAB® Simulink™ tool. Solid modeling 740 may be handled by any CAD software, such as Solidworks™ or the like. Finally, visualization 750 may be performed by any suitable visualization tool, such as a Scalable Vector Graphics (SVG) tool, Virtual Reality Modeling Language (VRML) tool, and others. Each of the above tools brings its own data structures and information formats into the design process. The challenge for the integrated design and validation environment is to combine the pieces of information into a common information exchange structure that can be used to harmonize the components into a rapid prototyping environment.

In FIG. 7, an example information flow of the integrated system is shown. The solid modeling phase 740 produces a three dimensional representation of the mechanical system to be controlled. The solid model may be converted into two information elements: a kinematics simulation and a graphical assembly. The Solidworks™ tool provides plugins to generate both data files as MATLAB® simulation and VRML export files.

The Studio5000™ tool by Rockwell Automation is an industrial control programming design tool 710 that is used to create control algorithms written in an International Electrotechnical Commission (IEC) 61131-based programming language. The control program is deployed in the virtual controller within industrial controller system 720.

The kinematics simulation is downloaded to the MATLAB® tool for simulating the machine under specific load conditions. The simulation model 730 interacts with the controller 720 at runtime to stimulate the controlling algorithms with the responses of the machine that is put under stress with dynamic loading and control profiles. Graphical assemblies will be further processed to become a hierarchical data structure of graphical description that can be animated in the visualization tool 750. The visualization tool collects the real-time data that is generated in the controller-to-simulation interaction.

Different techniques may be used to connect each phase of this information flow. In one implementation, control program parameters are transferred between the simulation model 730 and the controller 720 using an I/O interface. MATLAB® provides a SimMechanicsLinks plugin for CAD software Solidworks™ to transfer the CAD model produced in the solid modeling phase 740 into the simulation model 730. The simulation model 730 contains mass and inertial properties of each of the component parts of a machine described in the CAD drawings. This information is essential to generate accurate animation of the mechanical system.

Kinematics and dynamical information of the simulation model 730 can be used to generate realistic model conditions since the actual physical properties of the model are included in the simulation calculations. As discussed above, visualization 750 may be performed by any suitable visualization tool, such as a Scalable Vector Graphics (SVG) tool, Virtual Reality Modeling Language (VRML) tool, or any other simulation modeling tool. In at least one implementation, a high quality and realistic animation can be produced in any VRML-compatible tool using the exported VRML models. VRML provides an open source, platform-independent graphical language to create and view three dimensional models. VRML is a text-based language so it can be easily edited using any text editor. To bring the VRML tool into this workflow, it is necessary to attach an API to it so it can communicate with the other parts of the system. Of course, other tools besides VRML may be utilized for this purpose and are within the scope of this disclosure.

Based on this work flow, an application can be created using these different systems under one platform. Robots are widely used in industrial automation applications and their control algorithms are developed by system engineers. In an example, a six-axis articulated robot model may be used. A desired motion profile for the robot's end effector position is established in the controlling program 710 using command position profiles.

The command positions are points of desired motion trajectory for the end effector. To achieve a desired position of the end effector, different parts (links) of the robot must be placed in a position by the driving motors at the link joints. These motors are driven by torque signals that are to be calculated by the controlling drivers. However, the controlling torque depends on knowledge of the system response to the torque and the load at the end effector. In the classical design approach, these pieces of information are known by trial and error or by experienced designers. The intent here is to capture the information flow for automating the process of generating the feedback information for the drivers and controllers. Based on the drivers' torque signal, each joint will move and the end effector will move in the space to a target location. Current position is the feedback to the drivers and controllers for close loop control.

A work flow, validation framework, and process to enable a virtual design engineering environment have been presented. The environment enables interoperability of solid model design, controllers, simulation, and visualization tools into an integrated development environment. Results showed that the selected work flow and information exchange could be assembled in an automated system. The deployment of the virtual design engineering environment permitted observing in real-time the effect of the controlling algorithm on the machine prototype which was simulated and controlled by motion instructions. This disclosure enables early validation of controlling logic for complex industrial automation projects and manufacturing plants. The benefits include the reduction of engineering cost, time, and resources during the design and prototyping of industrial automation machinery. In addition, the virtual design engineering environment opens new opportunities to train engineers and operators in controlling machines, without the need for the physical presence of the actual machine.

It must be noted that the invention can be used in two main phases: design phase runtime and commissioned phase runtime. During design phase runtime, the industrial control device can be real or emulated. Either encapsulation is connected to the simulation. In commissioned phase runtime, the industrial control device and the simulation execute in parallel with a real controller. Additionally, another benefit of the system is to aid system engineers to create optimized industrial control programs. For example, the Studio5000™ tool by Rockwell Automation allows for online editing of the control program, and the design may be incrementally improved in virtual design.

Figure 8:
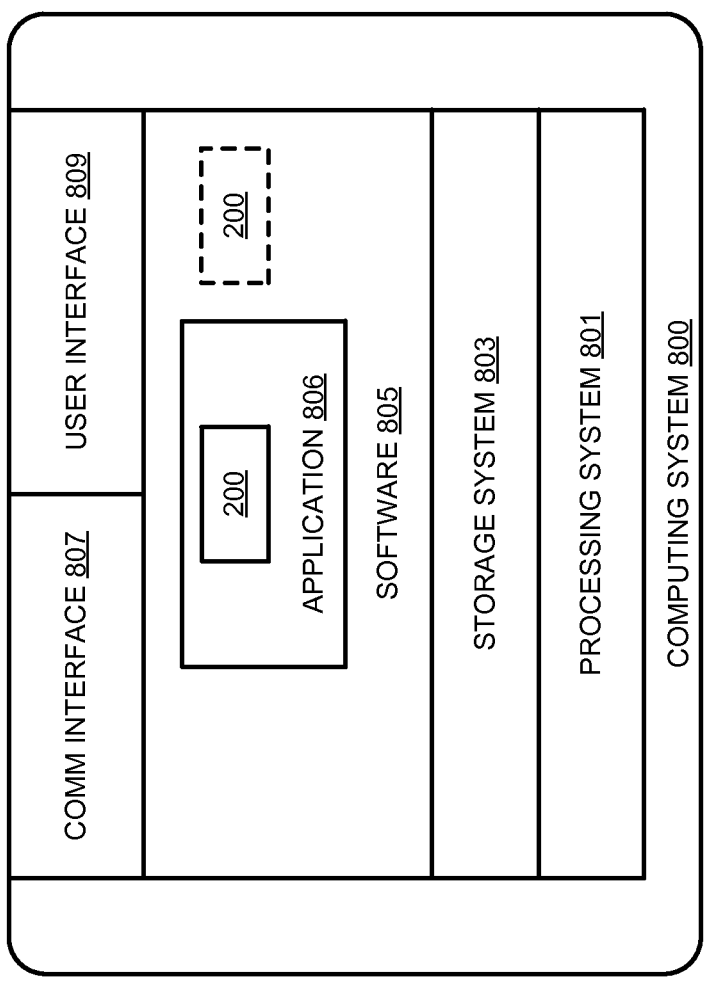
FIG. 8 is a block diagram that illustrates a computing system in an exemplary implementation.

FIG. 8 is a block diagram that illustrates computing system 800 in an exemplary implementation. Computing system 800 provides an example of computing system 100 or any system that may be used to facilitate simulating machines used in industrial automation, although other systems capable of performing the techniques disclosed herein could use alternative configurations, including computing system 100. Computing system 800 is representative of a computing system that may be employed in any computing apparatus, system, or device, or collections thereof. For example, computing system 800 may be employed in server computers, cloud computing platforms, data centers, any physical or virtual computing machine, and any variation or combination thereof. In addition, computing system 800 may be employed in desktop computers, laptop computers, tablets, smartphones, or the like.

Computing system 800 includes processing system 801, storage system 803, software 805, communication interface 807, and user interface 809. Processing system 801 is operatively coupled with storage system 803, communication interface 807, and user interface 809. Processing system 801 loads and executes software 805 from storage system 803. Software 805 includes application 806 which itself includes synchronization process 200. Synchronization process 200 may optionally be implemented separately from application 806. When executed by computing system 800 in general, and processing system 801 in particular, software 805 directs computing system 800 to operate as described herein for synchronization process 200 or variations thereof. Computing system 800 may optionally include additional devices, features, or functionality not discussed here for purposes of brevity.

Computing system 800 may be representative of any computing apparatus, system, or systems on which application 806 and synchronization process 200 or variations thereof may be suitably implemented. Examples of computing system 800 include mobile computing devices, such as cell phones, tablet computers, laptop computers, notebook computers, and gaming devices, as well as any other type of mobile computing devices and any combination or variation thereof. Note that the features and functionality of computing system 800 may apply as well to desktop computers, server computers, and virtual machines, as well as any other type of computing system, variation, or combination thereof.

Referring still to FIG. 8, processing system 801 may comprise a microprocessor and other circuitry that retrieves and executes software 805 from storage system 803. Processing system 801 may be implemented within a single processing device but may also be distributed across multiple processing devices or sub-systems that cooperate in executing program instructions. Examples of processing system 801 include general purpose central processing units, application specific processors, and logic devices, as well as any other type of processing device, combinations, or variations thereof.

Storage system 803 may comprise any non-transitory computer-readable media or storage media readable by processing system 801 and capable of storing software 805, such as a disk drive, flash drive, data storage circuitry, or some other hardware memory apparatus. In some examples, a computer apparatus could comprise storage system 803 and operating software 805. Storage system 803 may include volatile and nonvolatile, removable and non-removable media implemented in any method or technology for storage of information, such as computer readable instructions, data structures, program modules, or other data. Storage system 803 may be implemented as a single storage device but may also be implemented across multiple storage devices or sub-systems co-located or distributed relative to each other—including devices in different geographic areas. Storage system 803 may also be embedded in various types of equipment. Storage system 803 may comprise additional elements, such as a controller, capable of communicating with processing system 801. Examples of storage media include random access memory, read only memory, magnetic disks, optical disks, flash memory, virtual memory and non-virtual memory, magnetic cassettes, magnetic tape, magnetic disk storage or other magnetic storage devices, or any other medium which can be used to store the desired information and that may be accessed by an instruction execution system, as well as any combination or variation thereof, or any other type of storage media. In no case is the storage media a propagated signal.

In operation, processing system 801 loads and executes portions of software 805, such as synchronization process 200, in order to operate as described herein. In particular, software 805 may be implemented in program instructions and among other functions may, when executed by computing system 800 in general or processing system 801 in particular, direct computing system 800 or processing system 801 to utilize an application programming interface (API) to apply timestamps to data exchanged between a simulation model created in a simulation application and an industrial controller system external to the simulation model, and process the timestamps to synchronize the simulation model and the industrial controller system. Software 805 may include additional processes, programs, or components, such as operating system software or other application software. Examples of operating systems include Windows®, iOS®, and Android®, as well as any other suitable operating system. Software 805 may also comprise firmware or some other form of machine-readable processing instructions executable by processing system 801.

In general, software 805 may, when loaded into processing system 801 and executed, transform computing system 800 overall from a general-purpose computing system into a special-purpose computing system customized to facilitate simulating machines used in industrial automation as described herein for each implementation. Software 805 may also transform the physical structure of storage system 803. The specific transformation of the physical structure may depend on various factors in different implementations of this description. Examples of such factors may include, but are not limited to, the technology used to implement the storage media of storage system 803, whether the computer-storage media are characterized as primary or secondary storage, and the like. For example, if the computer-storage media are implemented as semiconductor-based memory, software 805 may transform the physical state of the semiconductor memory when the software is encoded therein. For example, software 805 may transform the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate this discussion.

Communication interface 807 may include communication connections and devices that allow for communication between computing system 800 and other computing systems (not shown) or services, over a communication network or collection of networks. Examples of connections and devices that together allow for inter-system communication may include network interface cards, antennas, power amplifiers, RF circuitry, transceivers, and other communication circuitry. The aforementioned network, connections, and devices are well known and need not be discussed at length here.

User interface 809 may include a voice input device, a touch input device for receiving a gesture from a user, a motion input device for detecting non-touch gestures and other motions by a user, and other comparable input devices and associated processing elements capable of receiving user input from a user. Output devices such as a display system, speakers, haptic devices, and other types of output devices may also be included in user interface 809. The aforementioned user input devices are well known in the art and need not be discussed at length here. User interface 809 may also include associated user interface software executable by processing system 801 in support of the various user input and output devices discussed above. Separately or in conjunction with each other and other hardware and software elements, the user interface software and devices may provide a graphical user interface, a natural user interface, or any other kind of user interface.

The functional block diagrams, operational sequences, and flow diagrams provided in the Figures are representative of exemplary architectures, environments, and methodologies for performing novel aspects of the disclosure. While, for purposes of simplicity of explanation, methods included herein may be in the form of a functional diagram, operational sequence, or flow diagram, and may be described as a series of acts, it is to be understood and appreciated that the methods are not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all acts illustrated in a methodology may be required for a novel implementation.

The above description and associated drawings teach the best mode of the invention. The following claims specify the scope of the invention. Some aspects of the best mode may not fall within the scope of the invention as specified by the claims. Also, while the preceding discussion describes embodiments employed specifically in conjunction with the monitoring and analysis of industrial processes, other applications, such as the mathematical modeling or monitoring of any man-made or naturally-existing system, may benefit from use of the concepts discussed above. Further, those skilled in the art will appreciate that the features described above can be combined in various ways to form multiple variations of the invention. As a result, the invention is not limited to the specific embodiments described above, but only by the following claims and their equivalents.

What is claimed is:

1. A computing system to facilitate simulating machines used in industrial automation comprising:
    one or more computer readable storage media;
    a simulation module, embodied at least in part in a first program instruction stored on the one or more computer readable storage media, comprising a simulation functional mock-up unit (FMU) for at least one simulation;
    a controller module, embodied at least in part in a second program instruction stored on the one or more computer readable storage media, comprising a controller FMU for at least one industrial controller and an application programming interface (API), wherein the API reads and writes tags for data exchanged between the controller module and the simulation module; and
    a co-simulation master, embodied at least in part in a third program instruction stored on the one or more computer readable storage media, that:
        connects the controller module to the simulation module;
        when the controller module transfers control data to the simulation module, utilizes the API to apply a first timestamp to the control data exchanged from the controller module to the simulation module to mark a first time;
        when the simulation module receives the control data, applies a second timestamp to the control data to mark a second time different than the first time; and
        processes the timestamps to synchronize the simulation module and the controller module.

2. The computing system of claim 1 wherein the controller module comprises another controller FMU for another industrial controller.

3. The computing system of claim 2 wherein the one industrial controller and the other industrial controller are each associated with a unique time step size and wherein the controller module sends periodic pulses to the one industrial controller and the other industrial controller according to their respective unique time step size.

4. The computing system of claim 1 wherein the co-simulation master uses an emulation simulation interface to format at least one of the following: the one industrial controller and the one simulation.

5. The computing system of claim 1 wherein the simulation module comprises definitions for a virtual representation of at least a portion of a machine used in an industrial automation environment.

6. The computing system of claim 5 wherein the simulation module generates an animated visualization of the machine based on the data exchanged between the controller module and the simulation module.

7. The computing system of claim 1 wherein the controller module comprises an emulated industrial controller implemented in software.

8. The computing system of claim 1 wherein the co-simulation master processes the timestamps to synchronize the simulation module and the controller module by sending a first clock pulse to the controller module according to a first time step size associated with the one industrial controller and sending a secondary clock pulse to the simulation module according to a secondary time step size associated with the simulation module, wherein the first time step size and the secondary time step size are different values.

9. A device implemented method to facilitate simulating machines used in industrial automation, the method comprising:
    via a co-simulation master embodied at least in part in program instructions stored on one or more computer readable storage media:
        connecting a controller module comprising a controller functional mock-up unit (FMU) for at least one industrial controller and an application programming interface (API), which reads and writes tags for data exchanged between the controller module and the simulation module, to a simulation module comprising at least one simulation;
        when the controller module transfers control data to the simulation module, utilizing the API to apply a first timestamp to the control data exchanged from the controller module to the simulation module to mark a first time;
        when the simulation module receives the control data, applying a second timestamp to the control data to mark a second time different than the first time; and
        processing the timestamps to synchronize the simulation module and the controller module;
    wherein the simulation module and the controller module are embodied at least in part in the program instructions stored on the one or more computer readable storage media.

10. The method of claim 9 wherein the controller module comprises another controller FMU for another industrial controller.

11. The method of claim 10 wherein the one industrial controller and the other industrial controller are each associated with a unique time step size; and further comprising, via the controller module, sending periodic pulses to the one industrial controller and the other industrial controller according to their respective unique time step size.

12. The method of claim 9 further comprising, via the co-simulation master, using an emulation simulation interface to format at least one of the following: the one industrial controller and the one simulation.

13. The method of claim 9 wherein the simulation module comprises definitions for a virtual representation of at least a portion of a machine used in an industrial automation environment.

14. The method of claim 13 further comprising, via the simulation module, generating an animated visualization of the machine based on the data exchanged between the controller module and the simulation module.

15. The method of claim 9 wherein the controller module comprises an emulated industrial controller implemented in software.

16. The method of claim 9 wherein processing the timestamps to synchronize the simulation module and the controller module further comprises sending a first clock pulse to the controller module according to a first time step size associated with the one industrial controller and sending a secondary clock pulse to the simulation module according to a secondary time step size associated with the simulation module, wherein the first time step size and the secondary time step size are different values.

\* \* \* \* \*